(12) United States Patent
Lobana et al.

(10) Patent No.: US 10,276,251 B1
(45) Date of Patent: Apr. 30, 2019

(54) PARTIAL MEMORY DIE WITH MASKED VERIFY

(71) Applicant: SANDISK TECHNOLOGIES LLC, Plano, TX (US)

(72) Inventors: Sukhminder Singh Lobana, Fremont, CA (US); Kirubakaran Periyannan, Santa Clara, CA (US); Ankitkumar Babariya, Milpitas, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 15/851,139

(22) Filed: Dec. 21, 2017

(51) Int. Cl.
G11C 7/00 (2006.01)
G11C 29/00 (2006.01)
G11C 16/34 (2006.01)
G11C 29/12 (2006.01)

(52) U.S. Cl.
CPC ...... G11C 16/3445 (2013.01); G11C 16/3459 (2013.01); *G11C 2029/1202* (2013.01); *G11C 2029/1204* (2013.01)

(58) Field of Classification Search
CPC ............ G11C 16/3445; G11C 16/3459; G11C 2019/1202; G11C 2029/1204
See application file for complete search history.

(56) References Cited

U.S. PATENT DOCUMENTS

| | | | | |
|---|---|---|---|---|
| 2006/0080498 | A1* | 4/2006 | Shoham | G06F 11/1064 711/108 |
| 2006/0221692 | A1* | 10/2006 | Chen | G11C 11/5642 365/185.11 |
| 2008/0052467 | A1* | 2/2008 | Thompson | G06F 12/0864 711/128 |
| 2011/0087815 | A1* | 4/2011 | Kruglick | G06F 13/24 710/260 |
| 2018/0277231 | A1* | 9/2018 | Kondo | G11C 16/3459 |

* cited by examiner

*Primary Examiner* — Toan K Le
(74) *Attorney, Agent, or Firm* — Vierra Magen Marcus LLP

(57) ABSTRACT

A memory system performs verification when writing to memory. It is possible that the memory system may be missing some components (or components may be otherwise unavailable). To account for missing or unavailable components when performing verification, the memory system uses a pattern of data that includes a mask identifying the missing or unavailable components. The mask is used to force a predetermined result of the verification for the missing or unavailable portions of the memory structure so that results of the verification that correspond to the missing or unavailable components are not counted as errors.

21 Claims, 13 Drawing Sheets

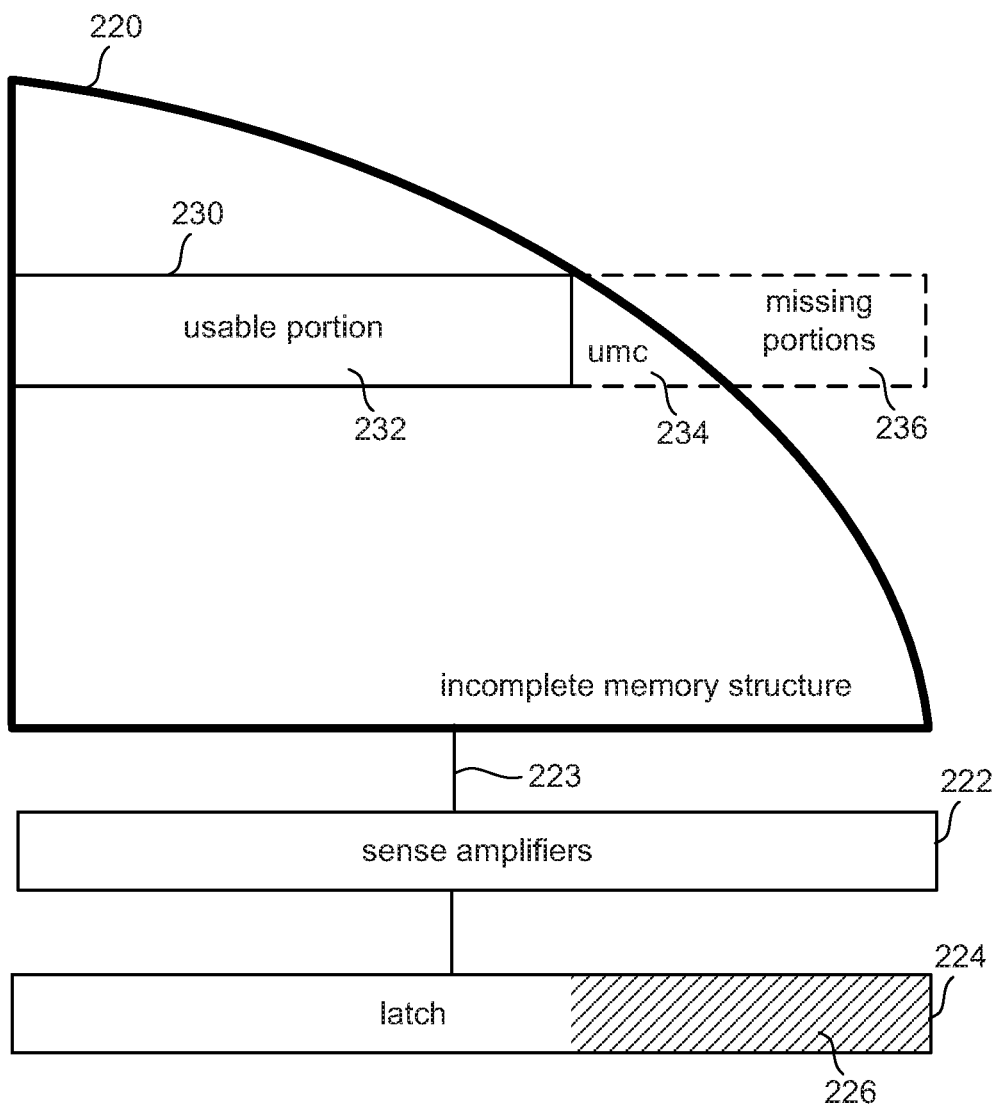

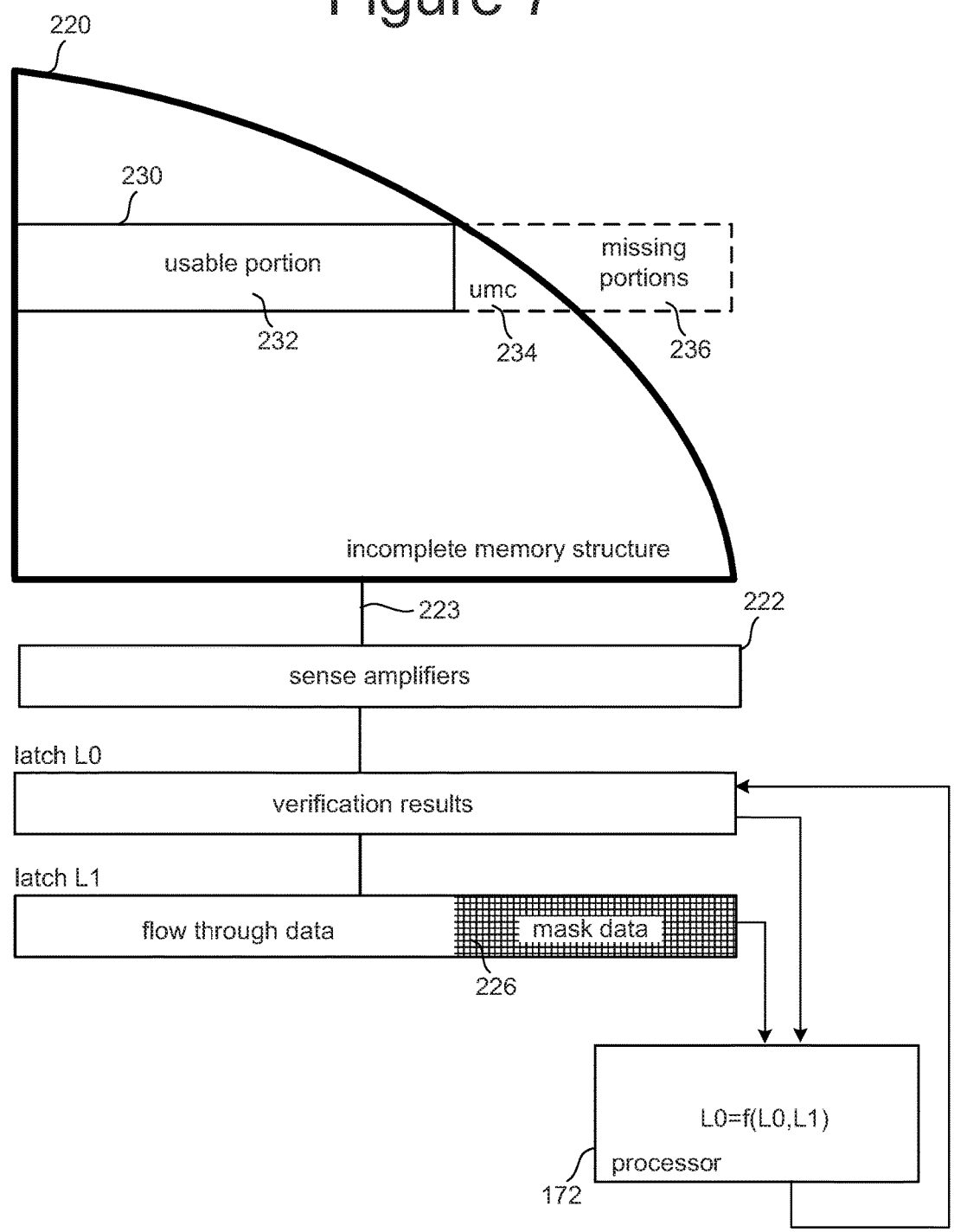

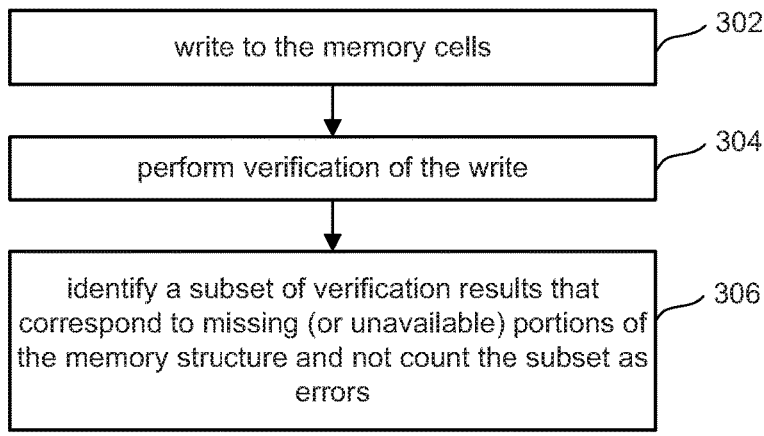
Figure 8
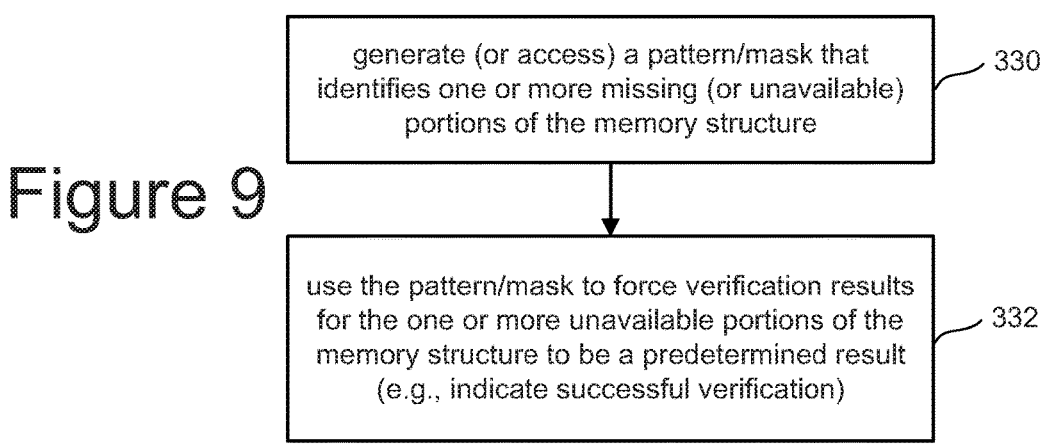
Figure 9
Figure 10A
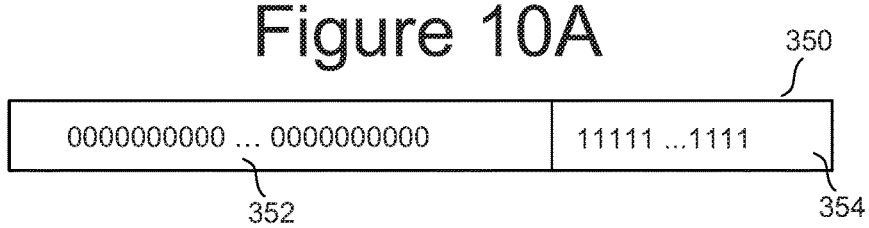
Figure 10B
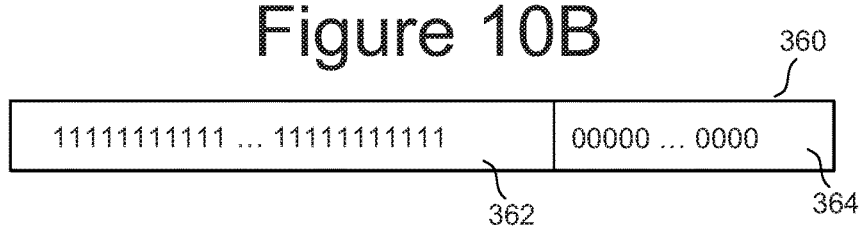

US 10,276,251 B1

PARTIAL MEMORY DIE WITH MASKED VERIFY

BACKGROUND

Semiconductor memories, such as flash memory and other types of memories, are often manufactured on a semiconductor wafer (or other material). Reticles are used to print circuits (or images of circuits) on the wafer. The reticle is moved across a wafer for a plurality of shots. Because the memory die is rectangular and the wafer is round, there will be dies printed at the edges for which a portion of the die is off the edge of the wafer, thereby making the die incomplete (and referred to as a partial memory die). For example, FIG. 1 depicts a wafer 10. A plurality of instances of a memory system are fabricated on wafer 10. Each instance of the memory system will become a memory die. Eventually, wafer 10 will be cut into separate dies in a process referred to as singulation. FIG. 1 shows dies A, B, C, D, E, F and G of wafer 10. It is likely that wafer 10 will include other dies in addition to dies A-G; however, those other dies are not depicted to make FIG. 1 easier to read. As can been seen, dies A-F are formed within the boundary of wafer 10. However, die G is fabricated at the edge of wafer 10 such that a portion of what should have been die G is off the edge of wafer 10 and, therefore, missing from die G. As a result, die G is a partial memory die.

In the past, partial memory dies were discarded because they were missing components and, therefore, did not function properly.

BRIEF DESCRIPTION OF THE DRAWINGS

Like-numbered elements refer to common components in the different figures.

FIG. 6 depicts a portion of a partial memory die.

FIG. 7 depicts a portion of a partial memory die.

FIG. 8 is a flow chart describing one embodiment of a process for writing and verifying.

FIG. 9 is a flow chart describing one embodiment of a process for identifying a subset of verification results that correspond to missing (or unavailable) portions of the memory structure and not counting the subset as errors.

FIG. 10A depicts one example of a pattern of data that includes a mask identifying missing or unavailable components.

FIG. 10B depicts one example of a pattern of data that includes a mask identifying missing or unavailable components.

DETAILED DESCRIPTION

It is proposed to utilize partial memory die in order to increase manufacturing yield and reduce waste. Therefore, more memory die from a wafer can be sold, which increases the revenue derived from a manufactured semiconductor wafer.

Figure 1:
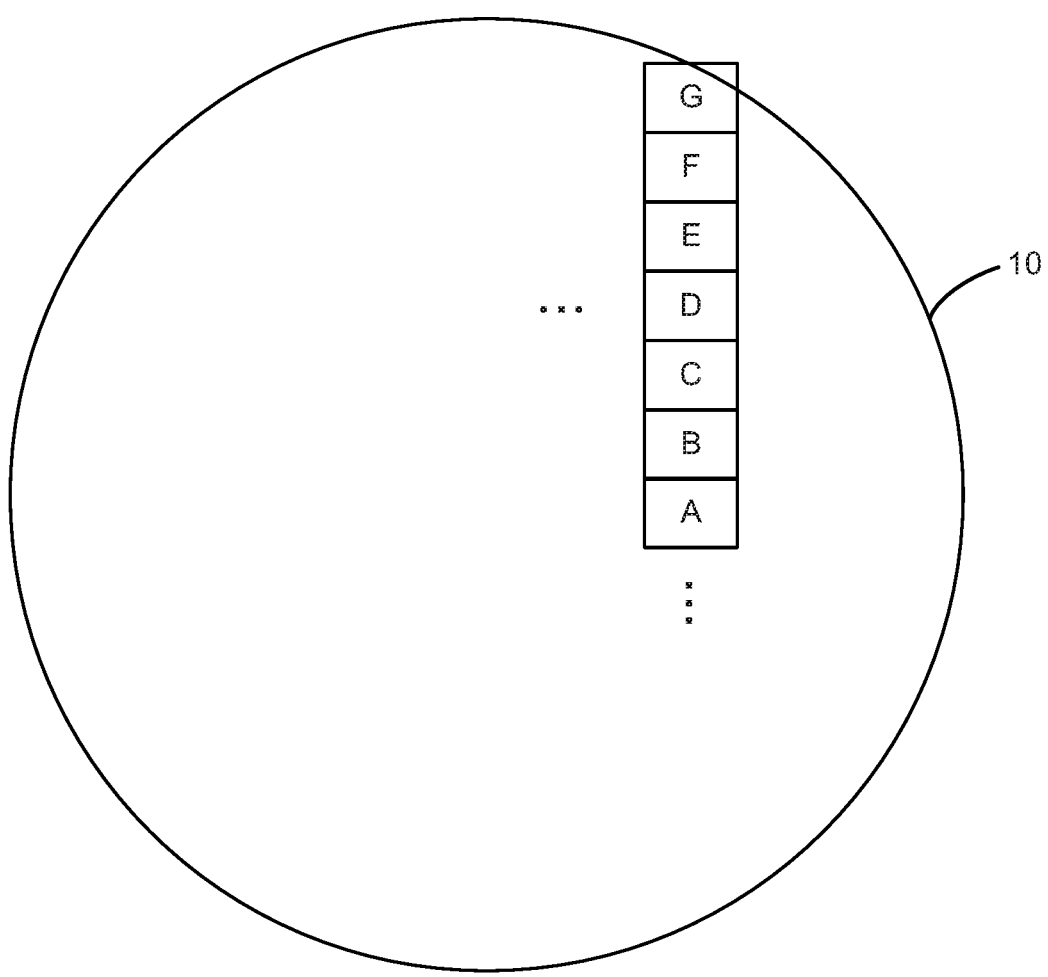
FIG. 1 depicts a wafer.

As used herein, a partial memory die may include a non-volatile memory structure that is missing components due to a portion of that memory structure not being printed (or otherwise fabricated). There may be a variety of reasons that the portion of the memory structure is not printed or otherwise fabricated. In certain embodiments, the portion of the memory structure is not printed or otherwise fabricated because the die positioning on the wafer results in some portion of the die being positioned on the wafer and another portion of the die being positioned beyond the edge of the wafer, as discussed above with respect to die G of FIG. 1. In some embodiments, the partial memory die also includes a control circuit connected to the memory structure. The control circuit is configured to write to the memory structure and read from the memory structure, even if the memory structure is missing components.

One embodiment of a partial memory die includes a memory system that performs verification when writing to memory. It is possible that the memory system may be missing some components (or components may be otherwise unavailable). To account for missing or unavailable components when performing verification, the memory system uses a pattern of data that includes a mask identifying the missing or unavailable components. The mask is used to force a predetermined result of the verification for the missing or unavailable portions of the memory structure so that results of the verification that correspond to the missing or unavailable components are not counted as errors.

Figure 2:
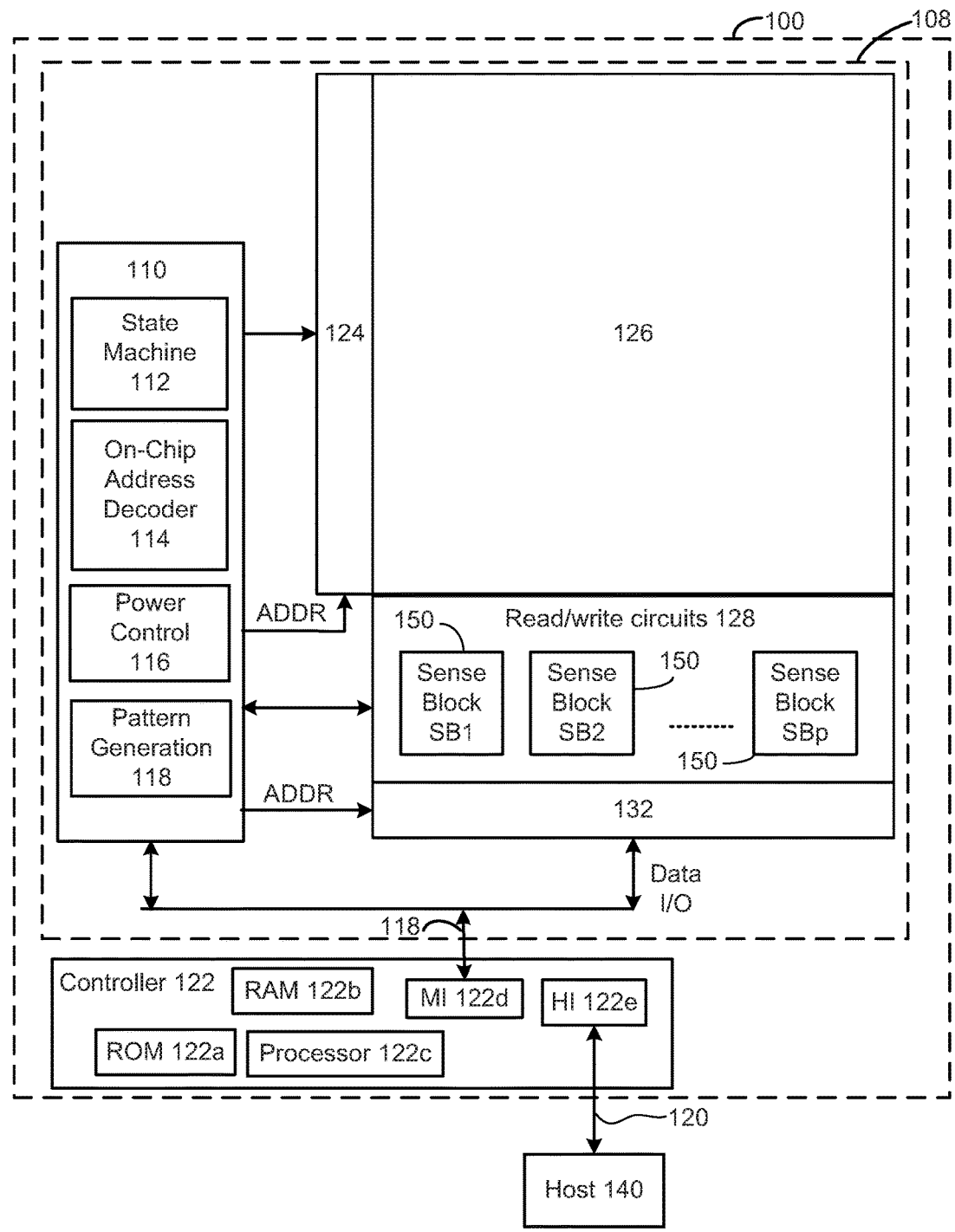
FIG. 2 is a block diagram of a memory system.

FIG. 2 is a functional block diagram of an example memory system 100. The components depicted in FIG. 2 are electrical circuits. Memory system 100 includes one or more memory dies 108. The one or more memory dies 108 can be complete memory dies or partial memory dies. In one embodiment, each memory die 108 includes a memory structure 126, control circuitry 110, and read/write circuits 128. Memory structure 126 is addressable by word lines via a row decoder 124 and by bit lines via a column decoder 132. The read/write circuits 128 include multiple sense blocks 150 including SB1, SB2, . . . , SBp (sensing circuitry) and allow a page of memory cells to be read or programmed in parallel.

In some systems, a controller 122 is included in the same package (e.g., a removable storage card) as the one or more memory die 108. However, in other systems, the controller can be separated from the memory die 108. In some embodiments the controller will be on a different die than the memory die 108. In some embodiments, one controller 122 will communicate with multiple memory die 108. In other embodiments, each memory die 108 has its own controller. Commands and data are transferred between a host 140 and controller 122 via a data bus 120, and between controller 122 and the one or more memory die 108 via lines 118. In one embodiment, memory die 108 includes a set of input and/or output (I/O) pins that connect to lines 118.

Control circuitry 110 cooperates with the read/write circuits 128 to perform memory operations (e.g., write, read, and others) on memory structure 126, and includes a state machine 112, an on-chip address decoder 114, a power control circuit 116 and a pattern generation circuit 118. The state machine 112 provides die-level control of memory operations. In one embodiment, state machine 112 is programmable by software. In other embodiments, state machine 112 does not use software and is completely implemented in hardware (e.g., electrical circuits). In one embodiment, control circuitry 110 includes buffers such as registers, ROM fuses and other storage devices for storing default values such as base voltages and other parameters.

The on-chip address decoder 114 provides an address interface between addresses used by host 140 or controller 122 to the hardware address used by the decoders 124 and 132. Power control module 116 controls the power and voltages supplied to the word lines and bit lines during memory operations. Power control module 116 may include charge pumps for creating voltages. The sense blocks include bit line drivers. Pattern generation circuit 118 is configured to generate a pattern that identifies one or more unavailable portions of the memory structure, as will be discussed in more detail below.

State machine 112 and/or controller 122 (or equivalently functioned circuits), in combination with all or a subset of the other circuits depicted in FIG. 2, can be considered a control circuit that performs the functions described herein. The control circuit can include hardware only or a combination of hardware and software (including firmware). For example, a controller programmed by firmware to perform the functions described herein is one example of a control circuit. A control circuit can include a processor, FGA, ASIC, integrated circuit or other type of circuit.

The (on-chip or off-chip) controller 122 (which in one embodiment is an electrical circuit) may comprise one or more processors 122*c*, ROM 122*a*, RAM 122*b*, a memory interface (MI) 122*d* and a host interface (HI) 122*e*, all of which are interconnected. The storage devices (ROM 122*a*, RAM 122*b*) store code (software) such as a set of instructions (including firmware), and one or more processors 122*c* is/are operable to execute the set of instructions to provide the functionality described herein. Alternatively or additionally, one or more processors 122*c* can access code from a storage device in the memory structure, such as a reserved area of memory cells connected to one or more word lines. RAM 122*b* can be to store data for controller 122, including caching program data (discussed below). Memory interface 122*d*, in communication with ROM 122*a*, RAM 122*b* and processor 122*c*, is an electrical circuit that provides an electrical interface between controller 122 and one or more memory die 108. For example, memory interface 122*d* can change the format or timing of signals, provide a buffer, isolate from surges, latch I/O, etc. One or more processors 122*c* can issue commands to control circuitry 110 (or another component of memory die 108) via Memory Interface 122*d*. Host interface 122*e* provides an electrical interface with host 140 data bus 120 in order to receive commands, addresses and/or data from host 140 to provide data and/or status to host 140.

In one embodiment, memory structure 126 comprises a three dimensional memory array of non-volatile memory cells in which multiple memory levels are formed above a single substrate, such as a wafer. The memory structure may comprise any type of non-volatile memory that are monolithically formed in one or more physical levels of arrays of memory cells having an active area disposed above a silicon (or other type of) substrate. In one example, the non-volatile memory cells comprise vertical NAND strings with charge-trapping material such as described, for example, in U.S. Pat. No. 9,721,662, incorporated herein by reference in its entirety.

In another embodiment, memory structure 126 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 126 is not limited to the examples above. Many different types of memory array architectures or memory technologies can be used to form memory structure 126. No particular non-volatile memory technology is required for purposes of the new claimed embodiments proposed herein. Other examples of suitable technologies for memory cells of the memory structure 126 include ReRAM memories, magnetoresistive memory (e.g., MRAM, Spin Transfer Torque MRAM, Spin Orbit Torque MRAM), phase change memory (e.g., PCM), and the like. Examples of suitable technologies for memory cell architectures of the memory structure 126 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe-Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
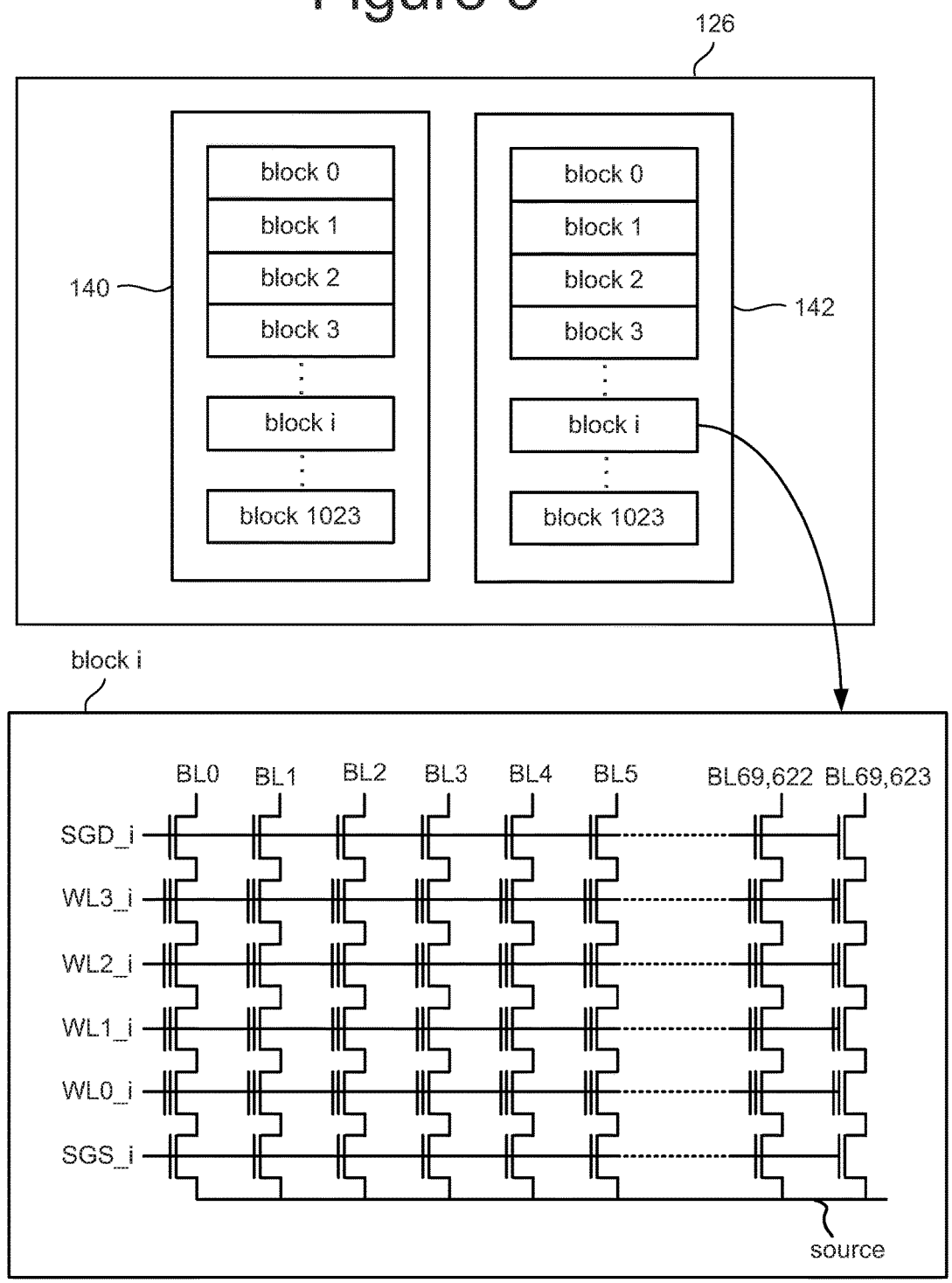
FIG. 3 is a block diagram of a non-volatile memory structure.

FIG. 3 depicts an example of memory structure 126. In one embodiment, an array of memory cells is divided into multiple planes. In the example of FIG. 3, memory structure 126 is divided into two planes: Plane 140 and Plane 142. In other embodiments, more or less than two planes can be used. In some embodiments, each plane is divided into a number of memory erase blocks (e.g., blocks 0-1023, or another amount). In certain memory technologies (e.g. 2D/3D NAND and other types of flash memory), a memory erase block is the smallest unit of memory cells for an erase operation. That is, each erase block contains the minimum number of memory cells that are erased together in a single erase operation. Other units of erase can also be used. In other memory technologies (e.g. MRAM, PCM, etc.) used in other embodiments implementing the solution claimed herein, memory cells may be overwritten without an erase operation and so erase blocks may not exist.

Each memory erase block includes many memory cells. The design, size, and organization of a memory erase block depends on the architecture and design for the memory structure 126. As used herein, a memory erase block is a contiguous set of memory cells that share word lines and bit lines; for example, erase block i of FIG. 3 includes memory cells that share word lines WL0_i, WL1_i, WL2_i and WL3_i and share bit lines BL0-BL69,623.

In one embodiment, a memory erase block (see block i) contains a set of NAND strings which are accessed via bit lines (e.g., bit lines BL0-BL69,623) and word lines (WL0, WL1, WL2, WL3). FIG. 3 shows four memory cells connected in series to form a NAND string. Although four cells are depicted to be included in each NAND string, more or less than four can be used (e.g., 16, 32, 64, 128, 256 or another number or memory cells can be on a NAND string). One terminal of the NAND string is connected to a corresponding bit line via a drain select gate, and another terminal is connected to the source line via a source select gate. Although FIG. 3 shows 69624 bit lines, a different number of bit lines can also be used.

Each memory erase block and/or each memory storage unit is typically divided into a number of pages. In one embodiment, a page is a unit of programming. Other units of programming can also be used. One or more pages of data are typically stored in one row of memory cells. For example, one or more pages of data may be stored in memory cells connected to a common word line. A page includes user data and overhead data (also called system data). Overhead data typically includes header information and Error Correction Codes (ECC) that have been calculated from the user data of the sector. The controller (or other component) calculates the ECC when data is being written into the array, and also checks it when data is being read from the array.

In the example discussed above, the unit of erase is a memory erase block and the unit of programming and reading is a page. Other units of operation can also be used. Data can be stored/written/programmed, read or erased a byte at a time, 1K bytes, 512K bytes, etc. No particular unit of operation is required for the claimed solutions described herein. In some examples, the system programs, erases, and reads at the same unit of operation. In other embodiments, the system programs, erases, and reads at different units of operation. In some examples, the system programs/writes and erases, while in other examples the system only needs to program/write, without the need to erase, because the system can program/write zeros and ones (or other data values) and can thus overwrite previously stored information.

As used herein, a memory storage unit is the set of memory cells representing the smallest storage unit of operation for the memory technology to store/write/program data in to the memory structure 126. For example, in one embodiment, the memory storage unit is a page sized to hold 4 KB of data. In certain embodiments, a complete memory storage unit is sized to match the number of physical memory cells across a row of the memory structure 126. In one embodiment, an incomplete memory storage unit has fewer physical memory cells than a complete memory storage unit.

Figure 4:
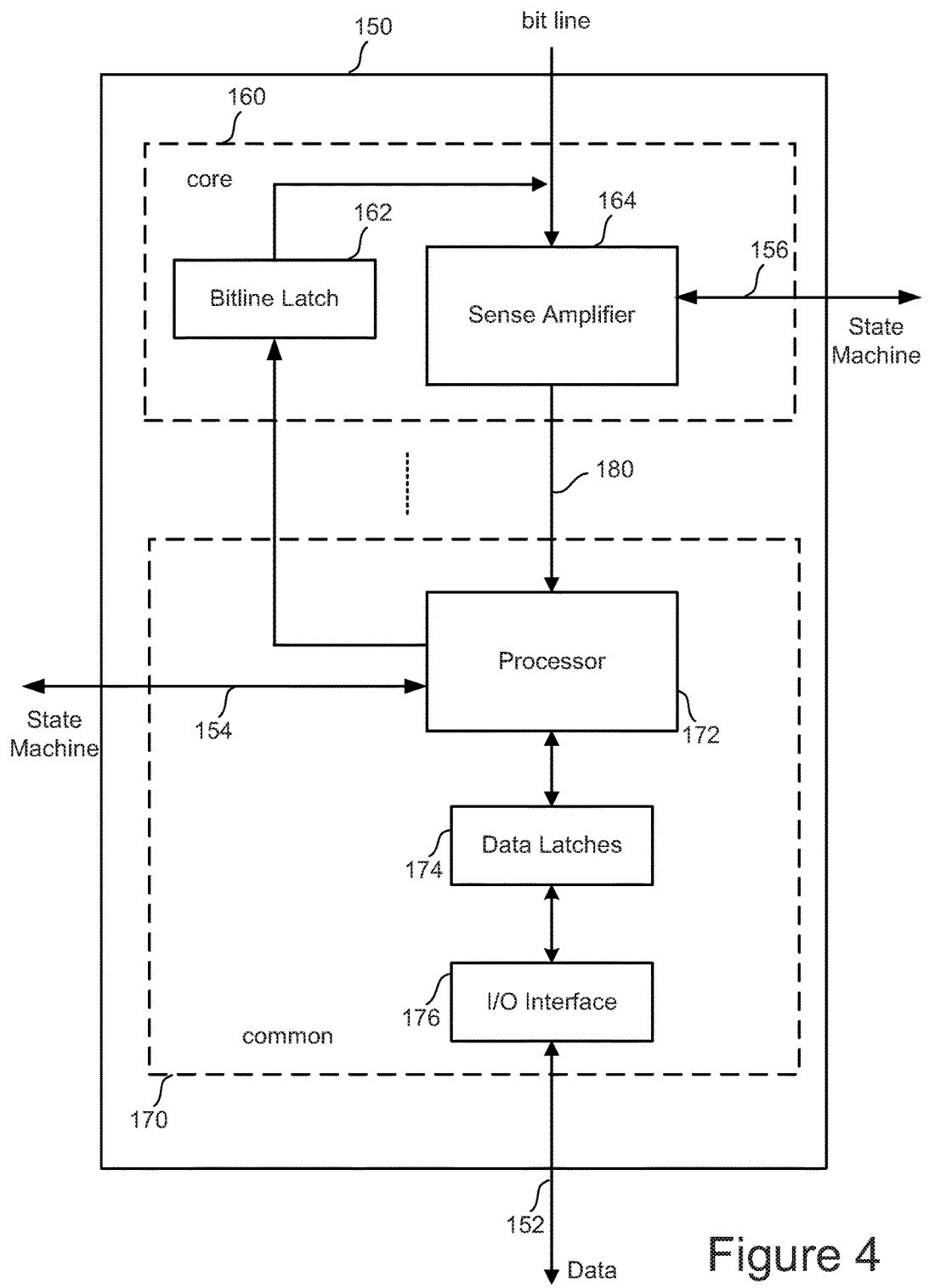
FIG. 4 is a block diagram that provides more details of a sense block.

FIG. 4 is a block diagram of an individual sense block 150 partitioned into a core portion, referred to as a sense module 160, and a common portion 170. In one embodiment, there will be a separate sense module 160 for each bit line and one common portion 170 for a set of multiple sense modules 160. In one example, a sense block will include one common portion 170 and eight sense modules 160. Each of the sense modules in a group will communicate with the associated common portion via a data bus 180. One example can be found in U.S. Patent Application Publication 2006/0140007, which is incorporated herein by reference in its entirety.

Sense module 160 comprises sense amplifier 164 that determines whether a conduction current in a connected bit line is above or below a predetermined level. Sense module 160 also includes a bit line latch 162 that is used to set a voltage condition on the connected bit line. For example, a predetermined state latched in bit line latch 162 will result in the connected bit line being pulled to a state designating program inhibit (e.g., Vdd) in order to lock out memory cells from programming.

Common portion 170 comprises a processor 172, a set of data latches 174 and an I/O Interface 176 coupled between the set of data latches 174 and data bus 152. Processor 172 performs computations. For example, one of its functions is to determine the data stored in the sensed memory cell and store the determined data in the set of data latches. The set of data latches 174 is used to store data bits determined by processor 172 during a read operation. It is also used to store data bits imported from the data bus 152 during a program operation. The imported data bits represent write data meant to be programmed into the memory. In one embodiment, the data latches include three bits per bit line; however, other embodiments can include more or less than three bits per bit line. I/O interface 176 provides an interface between data latches 174 and the data bus 152.

During read or sensing, the operation of the system is under the control of state machine 112 that controls (using power control 116) the supply of different control gate voltages to the addressed memory cell(s). As it steps through the various predefined control gate voltages corresponding to the various memory states supported by the memory, the sense module 160 may trip at one of these voltages and an output will be provided from sense module 160 to processor 172 via bus 180. At that point, processor 172 determines the resultant memory state by consideration of the tripping event(s) of the sense module and the information about the applied control gate voltage from the state machine via input lines 154. It then computes a binary encoding for the memory state and stores the resultant data bits into data latches 174. In another embodiment of the core portion 160, bit line latch 162 serves double duty, both as a latch for latching the output of the sense module 160 and also as a bit line latch as described above. In one embodiment, data latches 174 includes four latches for every associated bit line.

It is anticipated that some implementations will include multiple processors 172. In one embodiment, each processor 172 will include an output line (not depicted in FIG. 4) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 172 to accumulate the results of the associated bit lines such that the state machine need only read the wired-OR line one time.

During program or verify, the data to be programmed is stored in the set of data latches 174 from the data bus 152. During the verify process, processor 172 monitors the verified memory state relative to the desired memory state. When the two are in agreement, processor 172 sets the bit line latch 162 so as to cause the bit line to be pulled to a state designating program inhibit. This inhibits the memory cell coupled to the bit line from further programming even if it is subjected to programming pulses on its control gate. In other embodiments processor 172 initially loads the bit line latch 162 and the sense circuitry sets it to an inhibit value during the verify process.

In some implementations (but not required), the data latches are implemented as a shift register so that the parallel data stored therein is converted to serial data for data bus 152, and vice versa. In one preferred embodiment, all the data latches corresponding to the read/write block of memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the sensing operations and sense amplifiers can be found in (1) United States Patent Application Pub. No. 2004/0057287, "Non-Volatile Memory And Method With Reduced Source Line Bias Errors," published on Mar. 25, 2004; (2) United States Patent Application Pub No. 2004/0109357, "Non-Volatile Memory And Method with Improved Sensing," published on Jun. 10, 2004; (3) U.S. Patent Application Pub. No. 20050169082; (4) U.S. Patent Publication 2006/0221692, titled "Compensating for Coupling During Read Operations of Non-Volatile Memory," Inventor Jian Chen, filed on Apr. 5, 2005; and (5) U.S. Patent Application Publication No. 2006/0158947, titled "Reference Sense Amplifier For Non-Volatile Memory," Inventors Siu Lung Chan and Raul-Adrian Cernea, filed on Dec. 28, 2005.

In one embodiment, each processor 172 will count the number of errors during programming or erasing (ie bits yet to successfully complete programming or erasing). These separate counts for each processor 172 can be aggregated by one of the processors or sent to the state machine to be aggregated. By knowing how many bits have not yet completed programming or erasing, the system can determined when to stop the programming or erasing.

Figure 5A:
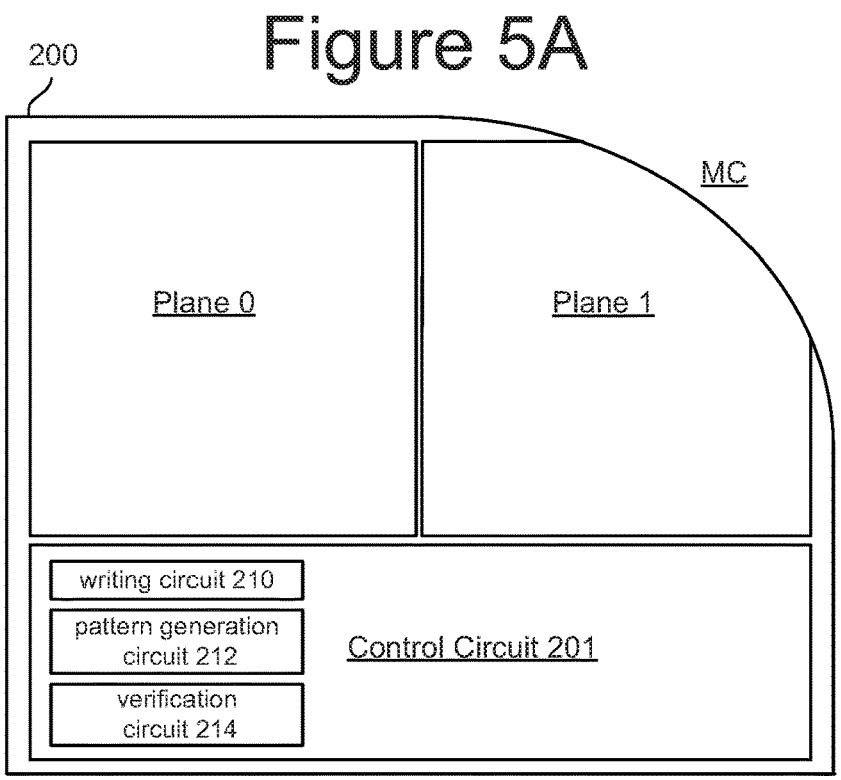
FIG. 5A depicts a partial memory die.

FIG. 5A shows a partial memory die 200, which includes an incomplete memory structure. As used herein, an incomplete memory structure is a memory structure that is missing components that it was designed to have. In certain embodiments, an incomplete memory structure is fabricated due to a fabrication side effect. As described herein, there are a variety of potential fabrication side effects. One example of a fabrication side effect may be, that the partial memory die 200 was positioned near an edge of a wafer such that the incomplete memory structure of the partial memory die is missing a portion that was not printed (or otherwise fabricated) on the wafer. That is, the incomplete memory structure of the partial memory die is missing components MC that should be part of the memory structure but they were not printed on the wafer because the die was positioned near the edge of the wafer, as explained above with respect to die G of FIG. 1. Another possible fabrication side effect may be misalignment of a wafer dicing machine such that parts of a die are cut during a dicing operation.

The incomplete memory structure of partial memory die 200 includes two planes: Plane 0 and Plane 1. In other embodiments, the memory structure can include more than two planes, or only one plane. Plane 0 is complete, meaning that it is not missing any portion or components. In the example of FIG. 6, Plane 1 is incomplete, meaning that Plane 1 is missing a portion of the plane that is supposed to be there. FIG. 5A shows that Plane 1 is missing components MC that were not printed on the die because the die was at the edge of the wafer. Thus, Plane 1 is missing components MC corresponding to components found in Plane 0. In one embodiment, Plane 1 is complete and Plane 0 is missing components. In another embodiment, both Plane 1 and Plane 0 are incomplete and missing components. In one embodiment, a complete memory die (or a complete plane of a memory die) may comprise a rectangular shape. Partial memory die 350 and Plane 1 are rectangular in shape except for the missing portion (e.g., missing components MC). In other embodiments, a complete memory die and a complete plane may have other shapes.

The missing components MC can include portions of the substrate, memory cells, entire NAND strings, portions of or entire bit lines, portions of or entire word lines, portions of or entire select lines and dielectric regions. In some embodiments, Plane 1 (or the incomplete memory array) comprises a plurality of memory storage units. Some of the memory storage units are complete memory storage units, meaning that they are not missing any components. Some of the memory storage units are incomplete memory storage units, meaning that they are missing components that they were intended to have and that correspond to components that complete memory storage units have. The incomplete memory storage units are referred to as physically partial memory storage units because they are missing memory components corresponding to memory components found in complete memory storage units, including missing silicon components corresponding to silicon components found in complete memory storage units. For example, the physically partial memory storage units (incomplete memory storage units) are missing non-volatile memory cells, bit lines, portions of bit lines, word lines, portions of word line and portions of substrate corresponding to respective memory cells, bit lines, portions of bit lines, word lines, portions of word line and portions of substrate found in complete memory storage units. The control circuits discussed herein are capable of successfully programming/writing, erasing and reading the physically partial memory storage units (incomplete memory storage units), as described below.

Plane 0 and Plane 1 have the same (ie common) address space size. For example, both planes may have intended to be storage for X gigabytes of data and have an address space big enough to address X gigabytes. Even though Plane 1 of FIG. 5A is incomplete, it still has the same address space size, even if it cannot use some of the address space due to missing memory cells.

Partial memory die 200 also includes control circuit 201, which is connected to Plane 0 and Plane 1. The incomplete memory structure (including Plane 0 and Plane 1) and the control circuit 201 together comprise a partial memory die. An example of control circuit 201 includes control circuitry 110 (including state machine 112), read/write circuits 128, decoders 124, and decoders 132 of FIG. 2. Other circuits can also be part of control circuit 301. The control circuit is configured to successfully program data to the incomplete memory storage unit and read data from the incomplete memory storage unit. Control circuit 201 is configured to write/program data to, and read data from, each memory storage unit regardless of whether the memory storage unit is a complete memory storage unit or an incomplete memory storage unit.

In one embodiment, control circuit 301 may include writing circuit 210, pattern generation circuit 212 (which may be the same as generation circuit 118), and verification circuit 214. These three circuits may be part of control circuitry 110 or may be part of an embodiment that has a different architecture than as depicted in FIG. 2. Writing circuit 210 is used to write to the memory cells of Plane 0 or Plane 1. The term writing can refer to programming and/or erasing. The term writing can also refer the storing of data in embodiments where the memory system only needs to write, without the need to erase, because the system can program/write zeros and ones (or other data values) and can thus overwrite previously stored information. Pattern generation circuit 212 is configured to generate a data pattern that identifies one or more unavailable portions of the memory structure, as will be discussed in more detail below. Verification circuit 214 performs verification for write operations (including programming and erasing). As will be discussed below, in one embodiment, verification circuit 214 is capable of using the data pattern from pattern generation circuit 212 to force verification results for one or more unavailable portions (e.g., such as missing portions) of the memory structure to indicate successful verification. For purposes of this document, verification results are the outcome of a verify operation. In general, a memory system verifies by sensing the condition of the memory and comparing the sensed condition to an intended condition. The outcome of that comparison are the verification results.

Figure 5B:
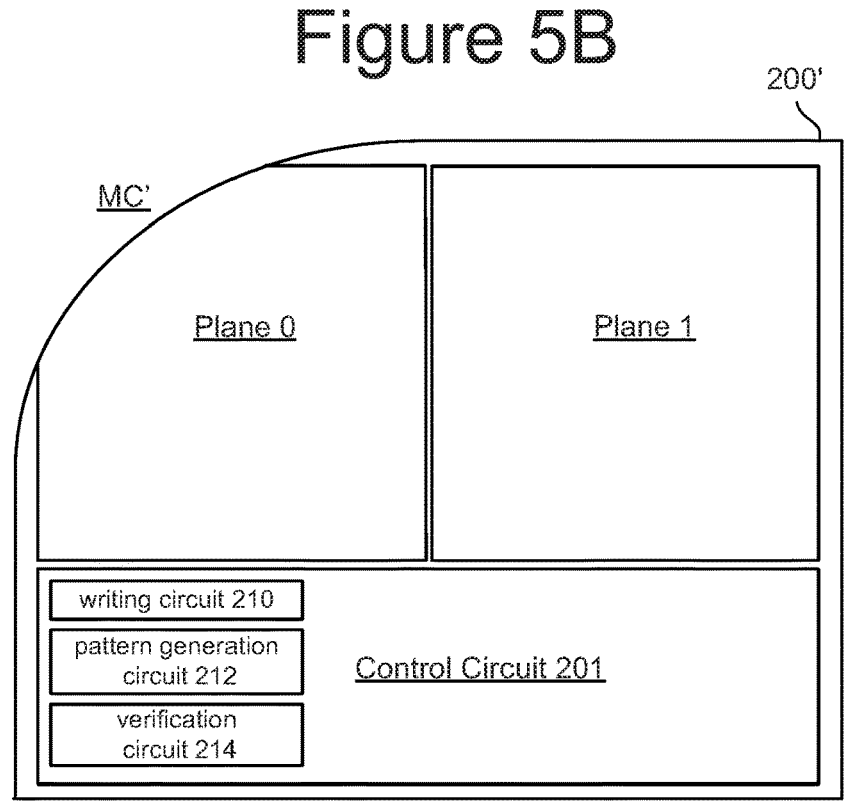
FIG. 5B depicts a partial memory die.

FIG. 5B shows partial memory die 200'. In FIG. 5A, Plane 1 is an incomplete memory structure. In FIG. 5B, Plane 0 is an incomplete memory structure. In other embodiments, Plane 0 and Plane 1 can both be incomplete memory structures. The technology described below can be used for partial memory die 200 and partial memory die 200', meaning that the proposed technology is equally usable to partial memory dies regardless of which side or plane has been damaged.

The technology proposed herein can also be used when a die is cracked, has a big particle sitting on the memory structure, or other analogous issue, in addition to (or rather than) when missing a portion. That is, the technology proposed herein can be used when there exists one or more unavailable portions of the memory structure. Unavailable portions of the memory structure can include missing portions, existing portions that are not usable because of missing portions, portions not usable because the die is cracked, portions not usable because a big particle sitting on memory structure, and the like.

FIG. 6 shows a portion 220 of a memory structure for a partial memory die. For example, portion 220 is part of memory structure 126 of FIG. 2 and can be part of an incomplete memory structure of either the embodiments of FIG. 5A or 5B (or a different embodiment). Box 230 represent a memory erase block (or other grouping of memory cells). Part of memory erase block 230 is missing; therefore, memory erase block 230 is an incomplete erase block. As depicted in FIG. 6, memory erase block 230 includes three sections: usable portion 232, unusable memory components (umc) 234 and missing portions (or missing components) 236. Usable portion 232 includes memory cells, bit lines, word lines, etc. that can still be used. Unusable memory components 234 include memory cells, bit lines, word lines, etc that are on the memory die but cannot be used because they are supposed to be connected to components that are missing or damaged. Missing portions (or missing components) 236 are not existing on the memory die due to a portion of that memory structure not being printed (or otherwise fabricated), as discussed above.

FIG. 6 shows portion 220 of the memory structure being connected to sense amplifiers 222 via bit lines 223. In one embodiment, sense amplifiers 222 can include a plurality of sense amplifiers 164 of FIG. 4 and there is one sense amplifier for each bit lines such that each bit line is connected to one sense amplifier. Sense amplifiers 222 are connected to latch 224. In one embodiment, latch 224 is a multibit latch (or register or other storage device) that represent a portion of data latches 174 of FIG. 4 for multiple common portions 170 (see FIG. 4). Each bit of latch 224 is connected to one sense amplifier.

In many memory systems, when writing to the memory a verification process is performed to verify that the writing process was successful. A verification process is a check to confirm that the programming/erasing/writing process properly set the memory cells to the intended values/data states. In certain embodiments, the verification process checks that each has been programmed to the intended data state. In certain embodiments, the verification process includes reading or sensing the data values stored in each memory cell and comparing those sensed data values to those values the writing process intended to store in the corresponding cells. Depending on the type of non-volatile memory used and the type of programming process used, a verification process may be performed one time or many times during the course of completing the programming process.

The results of the verification can be stored in latch 224. Each bit in latch 224 represents one memory cell (connected to one bit line and one sense amplifier). If the memory cell is verified to have been written successfully, then a first value is stored in latch 224. If the memory cell is not verified to have been written successfully, then a second value (error) is stored in latch 224. One or more processors 172 (optionally in combination with state machine 112) will count the number of errors (ie the number of bits with the second value). FIG. 6 shows a portion 226 of latch 224 being shaded, to illustrate the bits in latch 224 that corresponds to one or more unavailable portions of the memory structure, such as unusable memory components 234 and missing portions (or missing components) 236. The verification process will indicate that the one or more unavailable portions of the memory structure have not verified to have been written successfully; therefore, the second value (ie error value) is stored in latch 224 for those corresponding bits (shaded portion 226). The system can be programmed to write data to usable portion 232 of block 230, without writing to unusable memory components 234 and missing portions (or missing components) 236. However, since the sense amplifiers 222 are still on the die for all bit lines, all sense amplifiers will perform verification and those sense amplifiers that are supposed to be connected to the unusable memory components 234 and missing portions (or missing components) 236 will return an error even though there is not actually an error since the memory system is not trying to write data to unusable memory components 234 and missing portions (or missing components) 236. When the one or more processors 172 (optionally in combination with state machine 112) count the number of errors, they will count the error associated with unusable memory components 234 and missing portions (or missing components) 236, thereby, inflating the number of errors and possibly causing the write process to fail and/or be aborted. Therefore, it is proposed that the control circuit be configured to identify a subset of results of the verification that correspond to unusable memory components 234 and/or missing portions (or missing components) 236, and not count that subset of results as errors. For example, the results of the verification can be forced to indicate success, forced to indicate another predetermined condition, or ignored. This proposal is illustrated by FIG. 7.

FIG. 7 shows portion 220 of the memory structure for the partial memory die, including memory erase block (or other grouping of memory cells) 230, which comprises usable portion 232, unusable memory components (umc) 234 and missing portions (or missing components) 236. As described above with respect to FIG. 6, portion 220 of the memory structure is connected to sense amplifiers 222 via bit lines 223. In this manner bit lines 223 and sense amplifiers 222 are connected to memory erase block 230. FIG. 7 also shows sense amplifiers 222 connected to at least two latches: latch L0 and latch L1. Latch L0 is used to store the results from the verification of the writing (referred to as verification results). The verification results can be stored in latch L0 by sense amplifiers 222. Each bit in latch L0 represents one memory cell, and is connected to one bit line and one sense amplifier. To resolve the issue described above with respect to FIG. 6, latch L1 is used to store a data pattern that includes "flow through data" and "mask data." The mask data is also known as a mask. The mask data is used identify or mask one or more unavailable portions of the memory structure. The flow through data of the data pattern is used to identify data that need not be effected by the mask. In one embodiment, the control circuit (in one example implementation, the verification circuit 214 mentioned above) is configured to not count as errors the verification results corresponding to unavailable portions of the memory structure by performing a mathematical function [$f(L0,L1)$] on the pattern (L1) and verification results (L0) to change at least a subset of the verification results that correspond to the unavailable portions of the memory structure. In one embodiment, the mathematical function is a logical function (e.g., AND, OR, XOR, NOT, etc.) performed by one or more of processors 172 and the result of the mathematical function is stored in latch L0. Thus, the mathematical function uses the data pattern to force the verification results that correspond to the unavailable portions of the memory structure to indicate successful verification. In other embodiments, other mathematical functions can be used and the mathematical functions can be performed by circuits other than processors 172.

Note that the size and/or quantity of missing portions 236 can be based on the position of memory erase block 230. Thus, different memory erase blocks can have different masks. Therefore, a system may store or generate multiple masks and choose the appropriate mask to use based on the block address.

As discussed above, the memory system can be programmed to write data to usable portion 232 of block 230, without writing to unusable memory components 234 and missing portions (or missing components) 236. In some embodiments, the memory storage unit is a page that is across all memory cells connected to a common word line in a memory erase block. Therefore, when the memory system is to write data to only usable portion 232 of block 230, the memory system (i.e. the control circuit) is configured to write to only a portion of the memory storage unit. However, as discussed above with respect to FIG. 6, the sense amplifiers (which can be part of the control circuit) are configured to perform the verification for the entire memory storage unit of the memory cells. This disparity is now reconciled by the solution of FIG. 7 that uses a data pattern to mask the unusable (e.g., missing) portions of the memory storage unit that may be part of verification but are not part of the write process to insure successful verification for the missing (unavailable) portions of the memory structure masked by the mask.

FIG. 8 is a flow chart describing one embodiment of a process for writing and verifying based on the solution illustrated in FIG. 7. In step 302, data is written to memory cells in memory structure 126. In one embodiment, step 302 is performed by the components of FIG. 2 at the direction of state machine 112. In other embodiments, other control circuits can perform step 302. In some implementations, writing circuit 210 (which can be part of or separate from the state machine) performs step 302. In step 304 of FIG. 8, verification is performed for the write process of step 302. In one embodiment, step 302 is performed by the components of FIG. 2 at the direction of state machine 112. In other embodiments, other control circuits can perform step 304. In some implementations, verification circuit 214 (which can be part of or separate from the state machine) performs step 304. In step 306, a subset of the verification results of step 304 that correspond to missing (or unavailable) portions of the memory structure are identified, and that identified subset of results are not counted as verification errors. For example, a data pattern (e.g., generated by or accessed by pattern generation circuit 118 or 212) can be used to identify subset of results of the verification that correspond to missing (or unavailable) components. In one embodiment, step 306 is performed by the components of FIG. 2 at the direction of state machine 112. In other embodiments, other control circuits can perform step 306. In some implementations, verification circuit 214 (which can be part of or separate from the state machine) performs step 306.

FIG. 9 is a flow chart describing one embodiment of a process for identifying a subset of verification results that correspond to missing (or unavailable) portions of the memory structure and not counting the subset as errors. That is, FIG. 9 describes more details of one example embodiment of step 306 of FIG. 8. In step 330, the control circuit (e.g., pattern generation circuit 118 or 212) generates (or accesses) a pattern/mask that identifies one or more missing (or unavailable) portions of the memory structure. In step 332, the control circuit uses the pattern/mask to force verification results for the one or more unavailable portions of the memory structure to be a predetermined result (e.g., indicate successful verification).

FIG. 10A depicts one example of a pattern of data 350 that includes flow through data 352 and mask data 354. Mask data 354 identifies missing or unavailable components. In the embodiment of FIG. 10A, a 0 in the pattern indicates to not alter the data from the sense amplifier and a 1 in the pattern indicates that the data should not be counted when counting errors (e.g., force the data to show successful verification or ignore the result).

FIG. 10B depicts an example of a pattern of data 360 that includes flow through data 362 and mask data 364. Mask data 364 identifies missing or unavailable components. In the embodiment of FIG. 10B, a 1 in the pattern indicates to not alter the data from the sense amplifier and a 0 in the pattern indicates that the data should not be counted when counting errors (e.g., force the data to show successful verification or ignore the result). Other values can be used in the data pattern, including multiple bits, other characters/symbols, etc.

Figure 11:
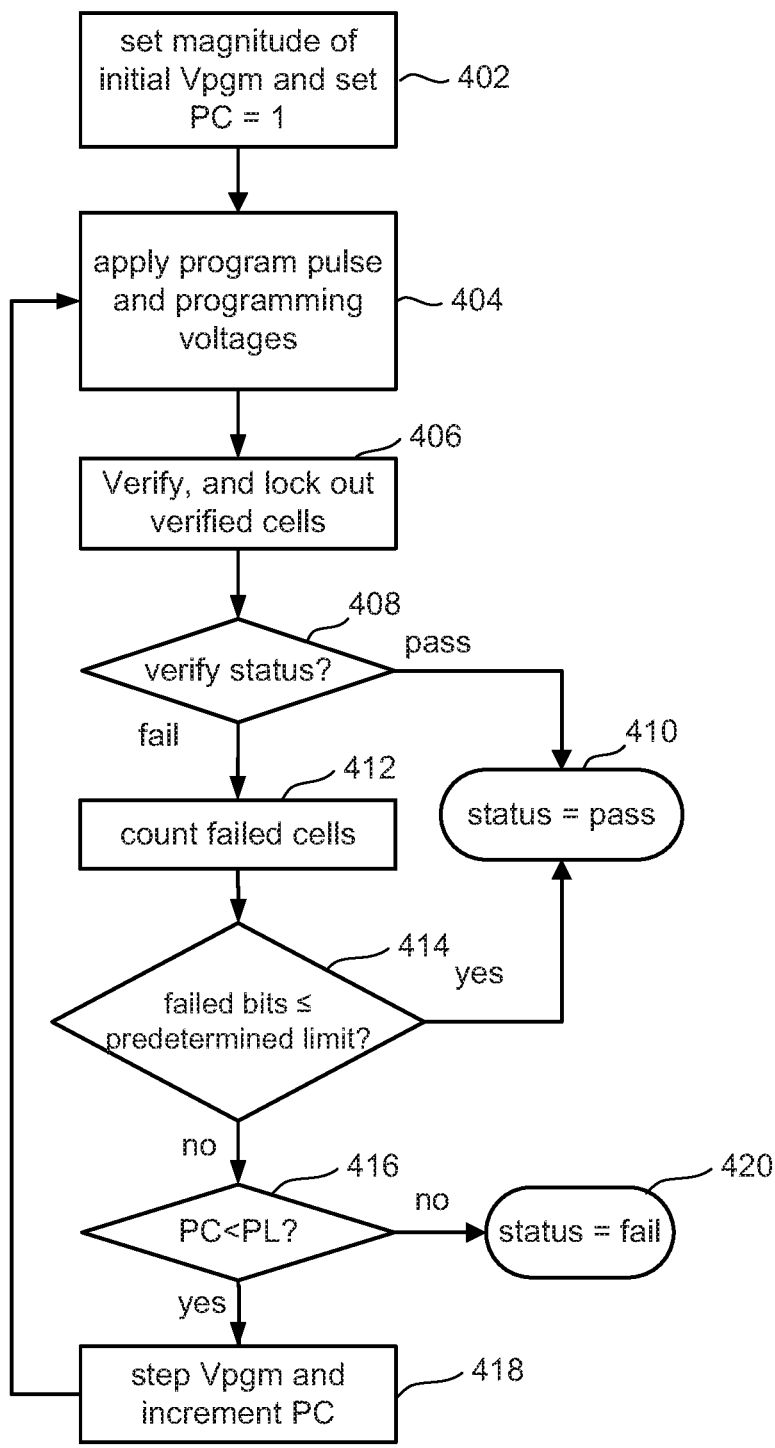
FIG. 11 is a flow chart describing one embodiment of a process for programming.

As discussed above, writing can include programming and/or erasing. FIG. 11 is a flow chart describing one embodiment of a process for programming that implements the process of FIG. 8. That is, FIG. 11 provides more details of one example implementation of the process of FIG. 8. The process of FIG. 11 applies to the embodiment where the sense amplifiers set bits of latch L0 to 1 for failed bits and to 0 for successfully programmed bits, and the data pattern sets bits to 1 for flow through data and sets bits to 0 for mask data. The mathematical function used is to AND the data pattern with the verification results to force to 0 (verification success) bits corresponding to missing (or unavailable) portions of the memory structure. The process of FIG. 11 is performed by the memory die. In one example embodiment, the process of FIG. 11 is performed on memory die 108 using the control circuit discussed above, at the direction of state machine 112.

Figure 12:
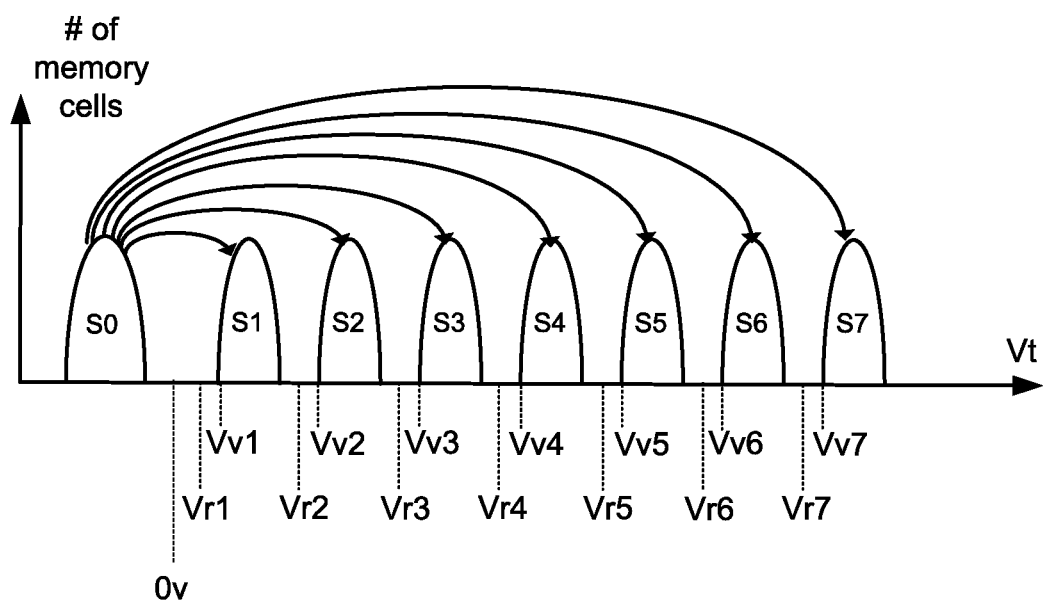
FIG. 12 depicts threshold voltage distributions representing data states.

The programming process of FIG. 11 causes the threshold voltages of the memory cells to be within one or more distributions of threshold voltages for programmed memory cells or within a distribution of threshold voltages for erased memory cells, as appropriate. FIG. 12 illustrates example threshold voltage distributions for the memory cell array when each memory cell stores three bits of data. Other embodiments, however, may use other data capacities per memory cell (e.g., such as one, two, four, or five bits of data per memory cell). FIG. 12 shows eight threshold voltage distributions, corresponding to eight data states. The first threshold voltage distribution (data state) S0 represents memory cells that are erased. The other seven threshold voltage distributions (data states) S1-S17 represent memory cells that are programmed and, therefore, are also called programmed data states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 12 also shows seven read reference voltages, Vr1, Vr2, Vr3, Vr4, Vr5, Vr6, and Vr7, for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 12 also shows seven verify reference voltages, Vv1, Vv2, Vv3, Vv4, Vv5, Vv6, and Vv7. When programming memory cells to data state S1, the system tests whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 12 represent the full sequence programming. The technology described herein can also be used with other types of programming in addition to full sequence programming (including, but not limited to, multiple stage/phase programming). In some embodiments, data states S1-S7 can overlap, with controller 122 relying on ECC to identify the correct data being stored.

In one embodiment, the data encoding per data state is: S0=111. S1=110, S2=200, S3=000, S4=010, S5=011, S6=001 and S7=101. Other encodings of data can also be used. No particular data encoding is required by the technology disclosed herein.

In step 402 of FIG. 11, the programming voltage (Vpgm) is initialized to the starting magnitude (e.g., ~12-16V or another suitable level) and a program counter PC maintained by state machine 112 is initialized at 1. The programming voltage Vpgm is the voltage driven on the word line so it is applied to the control gates of the memory cell. Typically, the program voltage applied as a series of program pulses. Between programming pulses are a set of verify pulses to perform verification. In many implementations, the magnitude of the program pulses is increased with each successive pulse by a predetermined step size. In one embodiment, the group of memory cells being programmed concurrently are all connected to the same word line (the selected word line). The unselected word lines receive one or more boosting voltages (e.g., ~7-11 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming.

In step 404, the program pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming. In step 406, the appropriate memory cells are verified using the appropriate set of verify reference voltages to perform one or more verify operations. In one embodiment, the verification process is performed by testing whether the threshold voltages of the memory cells selected for programming have reached the appropriate verify reference voltage.

In step 408, it is determined whether all the memory cells have reached their target threshold voltages (pass). If so, the programming process is complete and successful because all selected memory cells were programmed and verified to their target states. A status of "PASS" is reported in step 410. If, in 408, it is determined that not all of the memory cells have reached their target threshold voltages (fail), then the programming process continues to step 412.

In step 412, the system counts the number of memory cells that have not yet reached their respective target threshold voltage distribution. That is, the system counts the number of memory cells that have, so far, failed the verify process. This counting can be done by the state machine, the controller, the sense blocks (ie processors) or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 414, it is determined whether the count from step 412 is less than or equal to a predetermined limit. In one embodiment, the predetermined limit is the number of bits that can be corrected by error correction codes (ECC) during a read process for the page of memory cells. If the number of failed memory cells is less than or equal to the predetermined limit, than the programming process can stop and a status of "PASS" is reported in step 410. In this situation, enough memory cells programmed correctly such that the few remaining memory cells that have not been completely programmed can be corrected using ECC during the read process. In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 416 and the program counter PC is checked against the program limit value (PL). Examples of program limit values include 12, 20 and 30; however, other values can be used. If the program counter PC is not less than the program limit value PL, then the program process is considered to have failed and a status of FAIL is reported in step 420. This is one example of a program fault. If the program counter PC is less than the program limit value PL, then the process continues at step 418 during which time the Program Counter PC is incremented by 1 and the program voltage Vpgm is stepped up to the next magnitude. For example, the next pulse will have a magnitude greater than the previous pulse by a step size (e.g., a step size of 0.1-0.5 volts). After step 418, the process loops back to step 404 and another program pulse is applied to the selected word line so that another iteration (steps 404-418) of the programming process of FIG. 11 is performed.

In general, during verify operations and read operations, the selected word line is connected to a voltage, a level of which is specified for each read operation (e.g., see read reference voltages Vr1, Vr2, Vr3, Vr4, Vr5, Vr6, and Vr7, of FIG. 12) or verify operation (e.g. see verify reference voltages Vv1, Vv2, Vv3, Vv4, Vv5, Vv6, and Vv7 of FIG. 12) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Figure 13:
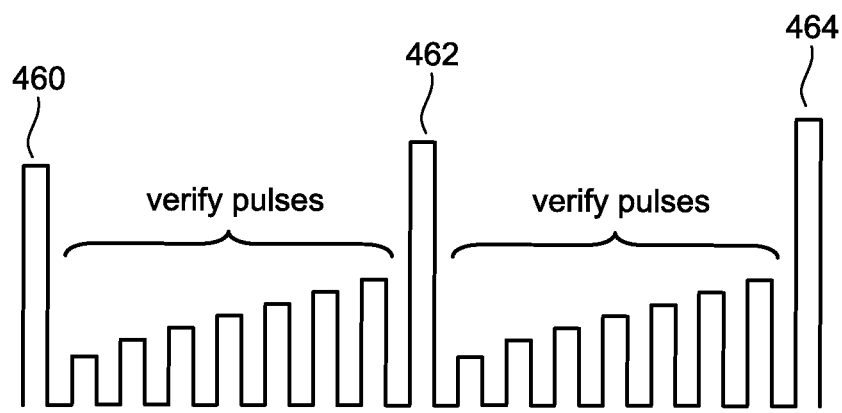
FIG. 13 depicts an example word line voltage used during programming and verification.

Step 404 of FIG. 11 includes applying a program voltage pulse on the selected word line. Step 406 of FIG. 11 includes verification, which in some embodiments comprises applying the verify reference voltages on the selected word line. As steps 404 and 406 are part of an iterative loop, the program voltage is applied as a series of programming pulses that step up in magnitude. Between programming pulses, verify reference voltages are applied. This is depicted in FIG. 13, which shows programming pulses 460, 462 and 464, applied during three successive iterations of step 404. Between programming pulses 460, 462 and 464, the system tests the memory cells using verify pulses to determine whether threshold voltages of the memory cells are greater than the respective verify reference voltages by applying the verify references voltages as voltage pulses.

Figure 14:
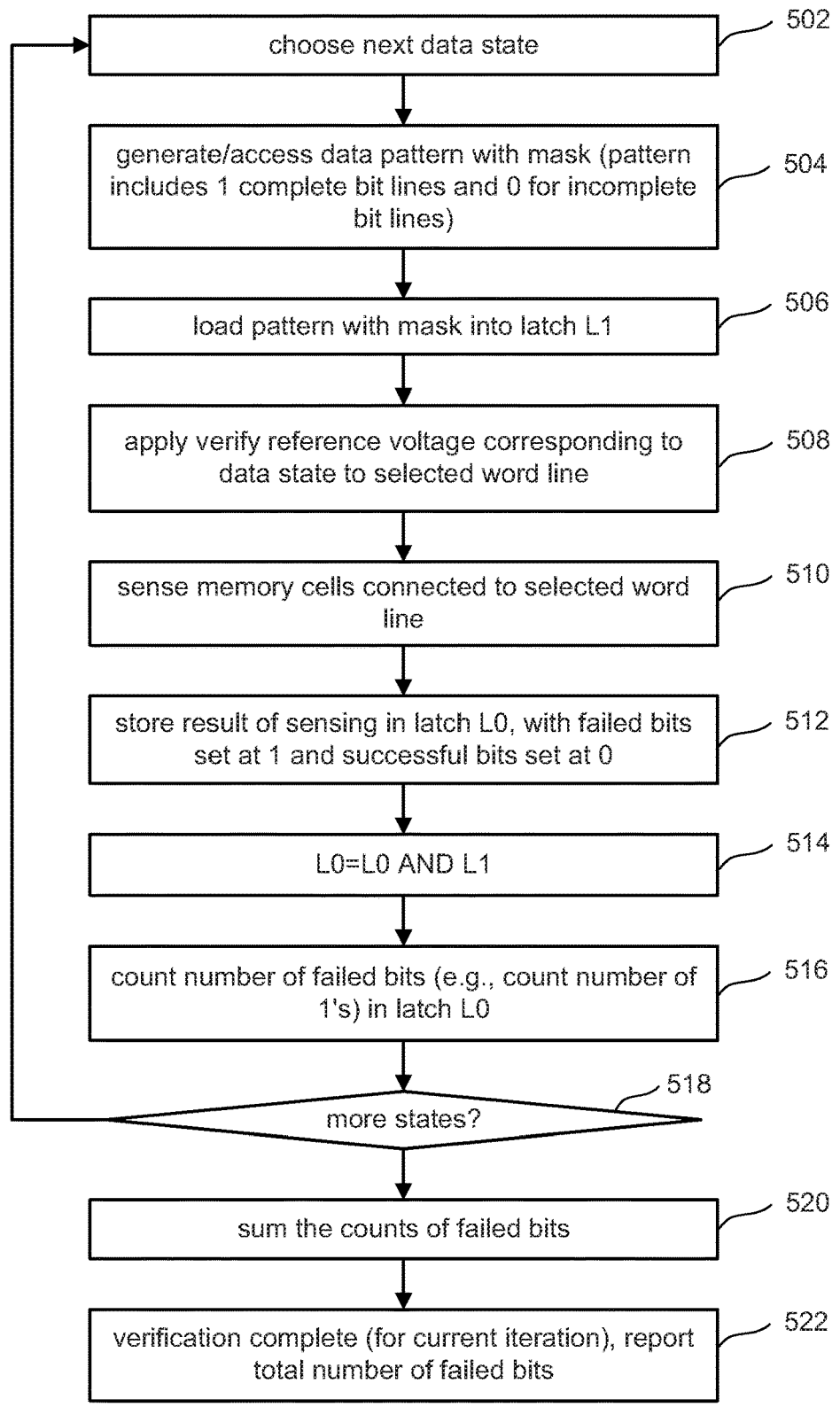
FIG. 14 is a flow chart describing one embodiment of a process for performing verification of programming.

FIG. 14 is a flow chart describing one embodiment of a process for performing verification of programming. The process depicted in FIG. 14 provides more details of one example implementation of steps 406 of FIG. 11. In step 502 of FIG. 14, the control circuit chooses the next data state to verify. As described above, in memory systems that store more than one bit per memory cell, there are multiple programmed data states. Therefore, the verification process between programming pulses test for multiple programmed data states. In some embodiment, all programmed data states are tested between programming pulses. In other embodiments, only a subset of programmed data states are tested between programming pulses using an intelligent algorithm to predict which programmed data states are possible for the current iteration of the programming process. The process of FIG. 14 is performed between programming pulses, and each iteration of the loop from steps 502-518 test for one programmed data state.

In step 504, the control circuits generates or accesses the data pattern with mask data. In one embodiment, the data pattern includes 1 for complete bit lines (e.g., all corresponding components exist) and 0 for incomplete bit lines (all or some corresponding components are missing). In some examples, the data pattern is created automatically or manually after testing and inspection during the manufacturing of the memory die, and then stored with pattern generation circuit 118 or 212 for future access. In other examples, information identifying what components are missing is determined after testing and inspection during the manufacturing of the memory die and stored on the memory die s that the data pattern can be created by pattern generation circuit 118 or 212 during operation of memory die 108. Therefore, in various embodiments, pattern generation circuit 118 or 212 can generate the data pattern by accessing a stored data pattern or creating a new data pattern.

In step 506, the data pattern (with the mask or mask data) is loaded in latch L1 (see FIG. 7). In step 508, the voltage pulse for the verify reference voltage is applied to the selected word line. In step 510, the sense amplifiers sense whether the connected memory cells turned on or did not turn on in response to the verify reference voltage. In step 512, the sense amplifiers store the result of the sensing in latch L0 (see FIG. 7). In this embodiment, the sense amplifiers store a 1 for each bit corresponding to a connected memory cell that failed verification and store a 0 for each bit corresponding to a connected memory cell that passed verification (ie successfully programmed). In step 514, the control circuit performs a mathematical function on the data pattern and verification results to change at least a subset of the verification results that correspond to missing (or unavailable) portions of the memory structure. In this embodiment, the mathematical function is a logical AND; therefore, the data pattern and the verification results are subjected to a logical AND by performing an AND operation on the contents of latch L0 (results) with the content of latch L1 (pattern) and storing the outcome of the AND operation back into latch L0. In step 516, the control circuit counts the number of failed bit, which in this embodiment is the number of 1's in latch L0.

In step 518, it is determined whether there are more programmed data states to verify. If so, the process loops back to step 502 and performs another iteration of the process of FIG. 14 for the next programmed data states. If there are no more programmed data states that need to be verified, then in step 520 the control circuit sums the counts of failed bits from each iteration of step 516 to create a total number of failed bits. In step 522, the verification process of FIG. 14 is complete for the current iteration of the programming process of FIG. 11. The total number of failed bits calculated in step 520 is reported.

Figure 15:
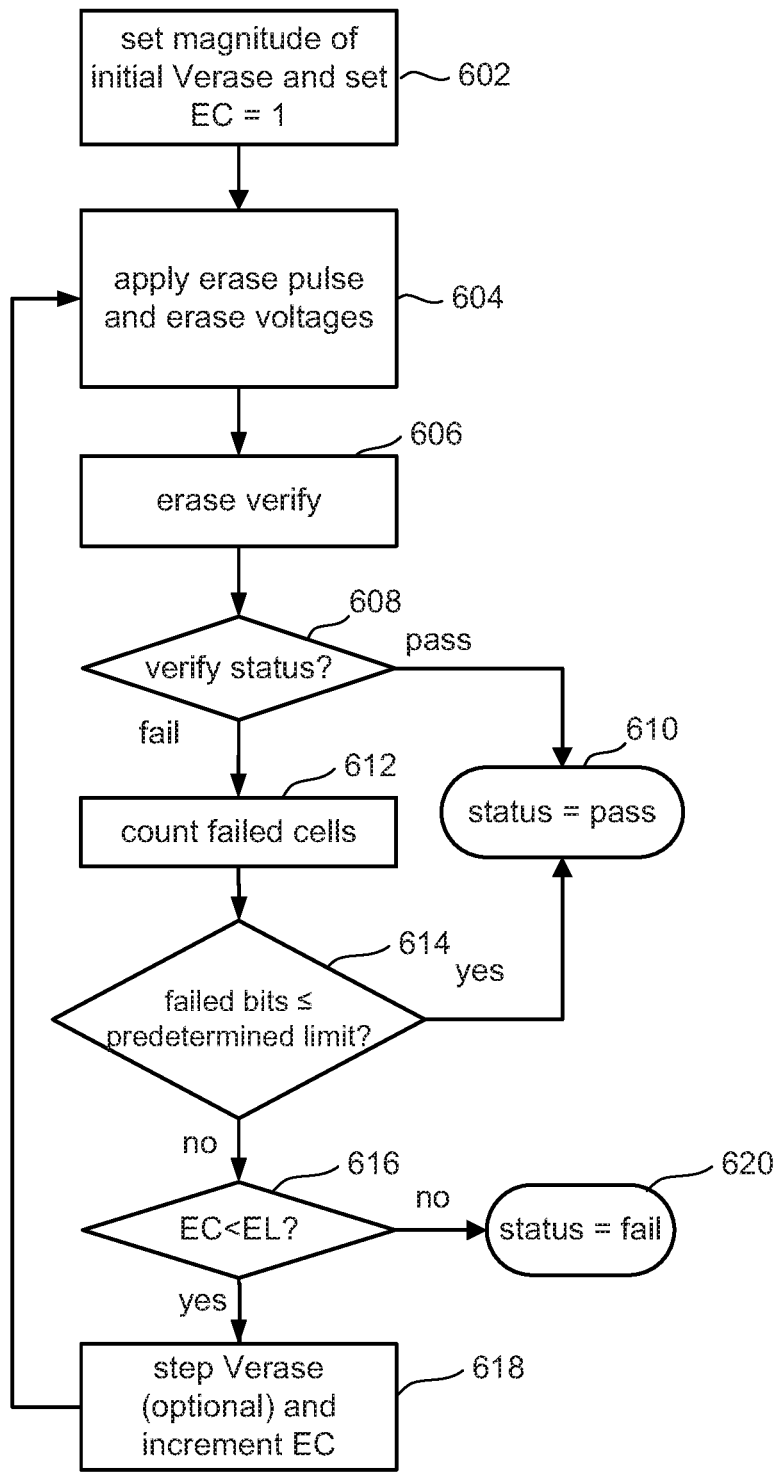
FIG. 15 is a flow chart describing one embodiment of a process for erasing.

As discussed above, writing can include programming and/or erasing. FIG. 15 is a flow chart describing one embodiment of a process for erasing that implements the process of FIG. 8. That is, FIG. 15 provides more details of one example implementation of the process of FIG. 8. The process of FIG. 15 applies to the embodiment where the sense amplifiers set bits of latch L0 to 0 for failed bits and to 1 for successfully erased bits, and the data pattern sets bits to 0 for flow through data; and sets bits to 1 for mask data. The mathematical function used is to OR the data pattern with the verification results to force to 1 (verification success) bits corresponding to missing (or unavailable) portions of the memory structure. The process of FIG. 15 is performed by the memory die 108. In one example embodiment, the process of FIG. 15 is performed on memory die 108 using the control circuit discussed above, at the direction of state machine 112.

In one embodiment, non-volatile memory cells are erased by raising the substrate or p-well that the memory cells are implemented in/on to an erase voltage (e.g., 20 volts) for a sufficient period of time (e.g., an erase voltage pulse) and grounding the word lines of a selected memory erase block while the source and bit lines are floating. A strong electric field is, thus, applied to the tunnel oxide layers of selected memory cells and the selected memory cells are erased as electrons are transferred to the substrate. Other techniques for erasing can also be used.

In step 602 of FIG. 15, the erase voltage (Verase) is initialized to the starting magnitude (e.g., ~20V or another suitable level) and an erase counter EC maintained by state machine 112 is initialized at 1. The erase voltage Verase is the voltage is applied to the substrate. Typically, the erase voltage applied as a series of voltage pulses. Between voltages pulses is an erase verify pulse to perform erase verification. In many implementations, the magnitude of the erase pulses remains constant. In step 604, the erase pulse is applied is applied to the substrate. In step 606, the memory cells of the memory erase block are verified to have been properly erased. In one embodiment, the erase verification process is performed by testing whether the threshold voltages of the memory cells of the erase block are below 0 volts (or a small voltage near 0 volts). In step 608, it is determined whether all the memory cells have been properly erased. If so, the erase process is complete and successful. A status of "PASS" is reported in step 610. If, in 608, it is determined that not all of the memory cells have been properly erased, then the erase process continues to step 612.

In step 612, the control circuit counts the number of memory cells that are not properly erased That is, the system counts the number of memory cells that have, so far, failed the erase verify process. This counting can be done by the state machine, the controller, the sense blocks (ie processors) or other logic. In step 614, it is determined whether the count from step 612 is less than or equal to a predetermined limit. In one embodiment, the predetermined limit is the number of bits that can be corrected by error correction codes (ECC) during a read process for the page of memory cells. If the number of failed memory cells is less than or equal to the predetermined limit, than the erase process can stop and a status of "PASS" is reported in step 610. In this situation, enough memory cells erased correctly such that the few remaining memory cells that have not been completely erased can be corrected using ECC during the read process. In another embodiment, the predetermined limit can be less than the number of bits that can be corrected by ECC during a read process to allow for future errors.

If number of failed memory cells is not less than the predetermined limit, than the erase process continues at step 616 and the erase counter PC is checked against the erase limit value (EL). Examples of erase limit values include 3, 4 and 5; however, other values can be used. If the erase counter EC is not less than the erase limit value EL, then the erase process is considered to have failed and a status of FAIL is reported in step 620. If the erase counter PEC is less than the erase limit value EL, then the process continues at step 618 during which time the erase counter EC is incremented by 1 and the erase voltage Verase is stepped up to the next magnitude. For example, the next pulse will have a magnitude greater than the previous pulse by a step size (e.g., a step size of 0.1-0.5 volts). After step 618, the process loops back to step 604 and another erase pulse is applied to the selected word line so that another iteration (steps 604-618) of the erase process of FIG. 15 is performed.

Figure 16:
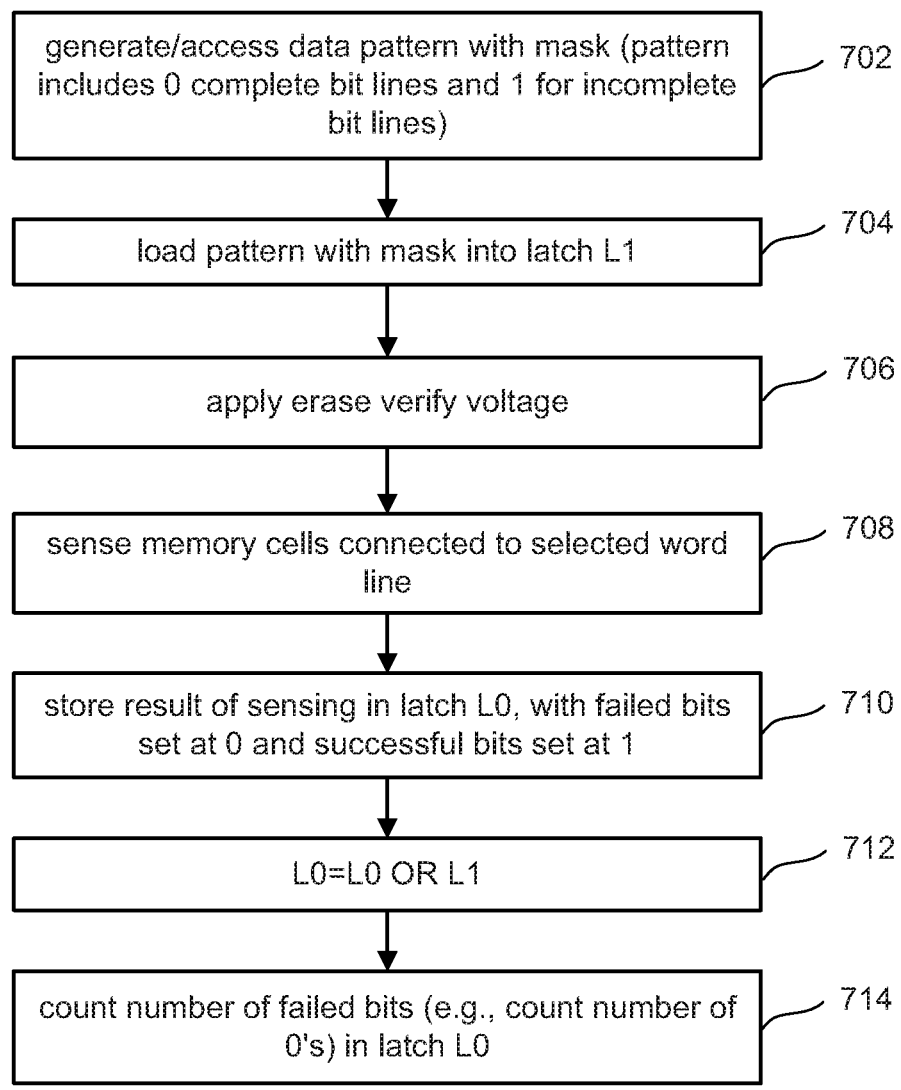
FIG. 16 is a flow chart describing one embodiment of a process for performing verification of erasing.

FIG. 16 is a flow chart describing one embodiment of a process for performing verification of erasing. The process depicted in FIG. 16 provides more details of one example implementation of steps 606 of FIG. 15. In step 702 of FIG. 14, the control circuits generates or accesses the data pattern with mask data. In this embodiment, the data pattern includes 0 for complete bit lines (e.g., all corresponding components exist) and 1 for incomplete bit lines (all or some corresponding components are missing). In step 704, the data pattern (with the mask or mask data) is loaded in latch L1 (see FIG. 7). In step 706, the voltage pulse for the erase verify voltage (e.g., 0 volts or a small voltage near 0 volts) is applied to the selected word line. In step 708, the sense amplifiers sense whether the connected memory cells turned on or did not turn on in response to the erase verify voltage. In step 710, the sense amplifiers store the result of the sensing in latch L0 (see FIG. 7). In this embodiment, the sense amplifiers store a 0 for each bit corresponding to a connected memory cell that failed verification and store a 1 for each bit corresponding to a connected memory cell that passed verification (ie successfully erased). In step 712, the control circuit performs a mathematical function on the data pattern and verification results to change at least a subset of the results of the verification that correspond to missing (or unavailable) portions of the memory structure. In this embodiment, the mathematical function is a logical OR; therefore, the data pattern and the verification results are subjected to a logical OR by performing an OR operation on the contents of latch L0 (results) with the content of latch L1 (pattern) and storing the outcome of the OR operation back into latch L0. In step 714, the control circuit counts the number of failed bits, which in this embodiment is the number of 0's in latch L0.

One embodiment includes an apparatus, comprising: a memory structure comprising a plurality of non-volatile memory cells; a writing circuit configured to write to the memory cells; and a verification circuit configured to verify the write to the memory cells and use a pattern to force verification results for one or more unavailable portions of the memory structure to indicate successful verification. In one example implementation, the verification circuit is configured to perform the verification for an entire memory storage unit of the memory cells; and the writing circuit is configured to write to only a portion of the memory storage unit.

One embodiment includes an apparatus, comprising: a memory structure comprising a plurality of non-volatile memory cells; and a control circuit connected to the memory structure. The control circuit is configured to write to the memory cells and perform verification of the write. The control circuit is configured to identify a subset of results of the verification that correspond to missing portions of the memory structure and not count the subset as errors.

In one example implementation, the memory structure includes a plurality of bit lines connected to the memory cells; the control circuit includes a plurality of sense amplifiers, each sense amplifier is connected to one of the bit lines; the control circuit is configured to use identify the subset of results of the verification that correspond to missing portions of the memory structure by using a data pattern that includes a bit for each sense amplifier of the plurality of sense amplifiers, each bit having a first value to indicate that a respective sense amplifier is connected to a bit line for a complete portion of the memory structure, each bit having a second value to indicate that a respective sense amplifier is connected to a bit line for an incomplete portion of the memory structure; the control circuit includes a first latch configured to store results of the verification, a second latch configured to store the data pattern, a circuit configured to perform a mathematical operation on contents of the first latch with contents of the second latch, and a counter configured to count instances of the second value in results of the mathematical operation.

One embodiment includes a method, comprising: writing to a memory structure; accessing a mask that masks one or more unavailable portions of the memory structure; verifying the writing to the memory structure; and using the mask to insure successful verifying for the one or more unavailable portions of the memory structure masked by the mask.

One example implementation further comprises generating the mask as a plurality of bits. Each bit corresponding to one of the sense amplifiers. Each bit having a first value to indicate that a respective sense amplifier is connected to a bit line for a complete portion of the memory structure. Each bit having a second value to indicate that a respective sense amplifier is connected to a bit line for an incomplete portion of the memory structure.

One embodiment includes an apparatus, comprising a partial memory die. The partial memory die comprises non-volatile memory cells; means for writing to the memory cells; and means for verifying the writing to the memory cells. The means for verifying includes means for masking a subset of verify results that correspond to one or more missing portions of the partial memory die to prevent the subset of verify results from being counted as verify errors.

Examples of the means for writing to the memory cells include the components of FIG. 2 at the direction of state machine 112, the control circuit described above, writing circuit 210, or similar circuits; performing all or a portion of the process of FIG. 11, FIG. 15, and/or another writing process.

Examples of the means for verifying the writing to the memory cells include the components of FIG. 2 at the direction of state machine 112, the control circuit described above, verification circuit 210 or similar circuits; performing all or a portion of the process of FIG. 14, FIG. 16, and/or another verification process.

Examples of the means for masking a subset of verify results that correspond to one or more missing portions of the partial memory die to prevent the subset of verify results from being counted as verify errors includes a latch (e.g., Latch L1), a register, a portion of RAM, a portion of other types of memory, state machine 112, the control circuit described above, or similar circuits.

One embodiment includes a system, comprising a controller and a memory die connected to the controller. The memory die comprises a control circuit and multiple planes of memory cells connected to the control circuit. At least one of the planes of memory cells comprises an incomplete memory structure due to missing portions. The control circuit is configured to write data to the incomplete memory structure and verify the data written with a mask configured to identify the missing portions and omit sensing results for the missing portions from verification results.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. An apparatus, comprising:
a memory structure comprising a plurality of non-volatile memory cells;
a writing circuit configured to write to the memory cells; and
a verification circuit configured to verify the write to the memory cells and use a pattern to force verification results for one or more unavailable portions of the memory structure to indicate successful verification.

2. The apparatus of claim 1, wherein:
the verification circuit is configured to verify for an entire memory storage unit of the memory cells; and
the writing circuit is configured to write to only a portion of the memory storage unit.

3. The apparatus of claim 1, wherein:
the verification circuit is configured to perform a mathematical function on the pattern and verification results to change at least a subset of the verification results for the one or more unavailable portions of the memory structure.

4. The apparatus of claim 1, wherein:
the memory structure includes bit lines connected to the memory cells;
the writing circuit is configured to program data into the memory cells;
the pattern includes logic zero for each bit line that corresponds to one or more unavailable portions of the memory structure; and
the verification circuit is configured to perform a logical AND of the pattern and verification results to change at least a subset of the verification results for the one or more unavailable portions of the memory structure.

5. The apparatus of claim 1, wherein:
the write to the memory cells is an erase operation;
the memory structure includes bit lines connected to the memory cells;
the writing circuit is configured to erase an erase block of the memory cells;
the pattern includes logic one for each bit line that corresponds to one or more unavailable portions of the memory structure; and
the verification circuit is configured to perform a logical OR of the pattern and verification results to change at least a subset of the verification results for the one or more unavailable portions of the memory structure.

6. The apparatus of claim 1, further comprising:
a pattern generation circuit configured to generate the pattern, the pattern masks the one or more unavailable portions of the memory structure, the memory structure is an incomplete memory structure on a partial memory die;
the writing circuit, the pattern generation circuit and the verification circuit are on the partial memory die.

7. An apparatus, comprising:
a memory structure comprising a plurality of non-volatile memory cells; and
a control circuit connected to the memory structure, the control circuit configured to write to the memory cells and perform verification of the write, the control circuit configured to identify a subset of verification results that correspond to missing portions of the memory structure and not count the subset as errors.

8. The apparatus of claim 7, wherein:
the control circuit is configured to perform the verification for an entire memory storage unit of the memory cells; and
the control circuit is configured to write to only a portion of the memory storage unit.

9. The apparatus of claim 7, wherein:
the control circuit is configured to use a data pattern to identify the subset of the verification results that correspond to missing portions of the memory structure; and
the control circuit is configured to not count the subset as errors by performing a mathematical function on the data pattern and the verification results to change at least a subset of the verification results that correspond to missing portions of the memory structure.

10. The apparatus of claim 7, wherein:
the control circuit is configured to use a data pattern to identify the subset of verification results that correspond to missing portions of the memory structure; and
the control circuit is configured to not count the subset as errors by performing a logical function on the pattern and the verification results to force verification results that correspond to missing portions of the memory structure to indicate successful verification.

11. The apparatus of claim 7, wherein:
the memory structure includes a plurality of bit lines connected to the memory cells;
the control circuit includes a plurality of sense amplifiers, each sense amplifier is connected to one of the bit lines; and
the control circuit is configured to use identify the subset of the verification results that correspond to missing portions of the memory structure by using a data pattern that includes a bit for each sense amplifier of the plurality of sense amplifiers, each bit having a first value to indicate that a respective sense amplifier is connected to a bit line for a complete portion of the memory structure, each bit having a second value to indicate that a respective sense amplifier is connected to a bit line for an incomplete portion of the memory structure.

12. The apparatus of claim 11, wherein:
the control circuit includes a first latch configured to store the verification results, a second latch configured to store the data pattern, a circuit configured to perform a mathematical operation on contents of the first latch with contents of the second latch, and a counter configured to count instances of the second value in results of the mathematical operation.

13. The apparatus of claim 7, wherein:
the memory structure is an incomplete memory structure on a partial memory die; and
the control circuit is on the partial memory die.

14. The apparatus of claim 7, wherein:
the memory structure includes bit lines connected to the memory cells;
the control circuit is configured to write to the memory cells by programming data into the memory cells;
the control circuit is configured to use a data pattern to identify the subset of the verification results that correspond to missing portions of the memory structure, the data pattern includes logic zero for each bit line that corresponds to one or more missing portions of the memory structure; and
the control circuit is configured to perform a logical AND of the data pattern and the verification results to change at least some of the verification results for the one or more missing portions of the memory structure.

15. The apparatus of claim 7, wherein:
the memory structure includes bit lines connected to the memory cells;
the control circuit is configured to write to the memory cells by changing the memory cells to an erased state;
the control circuit is configured to use a data pattern to identify the subset of verification results that correspond to missing portions of the memory structure, the data pattern includes logic one for each bit line that corresponds to one or more missing portions of the memory structure; and
the control circuit is configured to perform a logical OR of the data pattern and the verification results to change at least some of the verification results for the one or more missing portions of the memory structure.

16. A method, comprising:
writing to a memory structure;
accessing a mask that masks one or more unavailable portions of the memory structure;
verifying the writing to the memory structure; and
using the mask to insure successful verification for the one or more unavailable portions of the memory structure masked by the mask.

17. The method of claim 16, wherein:
the writing to the memory structure comprises writing to an incomplete memory structure of a partial memory die.

18. The method of claim 16, wherein:
the memory structure includes bit lines connected to non-volatile memory cells;
each bit line is connected to a sense amplifier of a plurality of sense amplifiers;
the mask includes an indication for a subset of sense amplifiers of the plurality of sense amplifiers;
the verifying includes determining a verify result for each sense amplifier; and
the using the mask includes forcing an indication of success for each sense amplifier of subset of sense amplifiers in response to the mask.

19. The method of claim 18, further comprising:
generating the mask as a plurality of bits, each bit corresponding to one of the sense amplifiers, each bit having a first value to indicate that a respective sense amplifier is connected to a bit line for a complete portion of the memory structure, each bit having a second value to indicate that a respective sense amplifier is connected to a bit line for an incomplete portion of the memory structure.

20. An apparatus, comprising:
a partial memory die comprising:
non-volatile memory cells;
means for writing to the memory cells; and
means for verifying the writing to the memory cells, the means for verifying includes means for masking a subset of verify results that correspond to one or more missing portions of the partial memory die to prevent the subset of verify results from being counted as verify errors.

21. A system, comprising:
a controller; and
a memory die connected to the controller, the memory die comprises a control circuit and multiple planes of memory cells connected to the control circuit, at least one of the planes of memory cells comprises an incomplete memory structure due to missing portions, the control circuit configured to write data to the incomplete memory structure and verify the data written with a mask configured to identify the missing portions and omit sensing results for the missing portions from verification results.

* * * * *